United States Patent [19]

Takabayashi et al.

[11] Patent Number: 5,094,697

[45] Date of Patent: Mar. 10, 1992

[54] PHOTOVOLTAIC DEVICE AND METHOD FOR PRODUCING THE SAME

[75] Inventors: Akiharu Takabayashi, Hikone; Takao Yonehara, Atsugi, both of Japan

[73] Assignee: Canon Kabushiki Kaisha, Tokyo, Japan

[21] Appl. No.: 538,007

[22] Filed: Jun. 14, 1990

[30] Foreign Application Priority Data

Jun. 16, 1989 [JP] Japan .................... 1-152412

[51] Int. Cl.⁵ .................... H01L 31/06; H01L 31/18; H01L 31/078
[52] U.S. Cl. .................... 136/249; 136/258; 357/30; 437/2; 437/4
[58] Field of Search .................... 136/249 TJ, 258 PC; 357/30 J, 30 K; 437/2-5

[56] References Cited

U.S. PATENT DOCUMENTS 4,633,030 12/1986 Cook .................... 136/246
4,657,603 4/1987 Kruehler et al. .................... 437/83
4,677,250 6/1987 Barnett et al. .................... 136/258 PC

FOREIGN PATENT DOCUMENTS 0276961 8/1988 European Pat. Off. ...... 136/258 PC
58-188169 11/1983 Japan .................... 136/249 TJ
1-51671 2/1989 Japan .................... 136/258 PC

*Primary Examiner*—Aaron Weisstuch
*Attorney, Agent, or Firm*—Fitzpatrick, Cella, Harper & Scinto

[57] ABSTRACT

A photovoltaic device comprises a substrate having a plurality of conductive surfaces surrounded by an insulating surface, a plurality of first photovoltaic elements having single-crystal layer regions covering said conductive surfaces, and a second photovoltaic element covering said plurality of first photovoltaic elements.

The single-crystal layer regions are separated from each other.

13 Claims, 2 Drawing Sheets

PHOTOVOLTAIC DEVICE AND METHOD FOR PRODUCING THE SAME

BACKGROUND OF THE INVENTION

1. Field of the Invention

The present invention relates to a photovoltaic device to be used preferably for solar cell, photosensors, solid state pickup devices, etc., and, more particularly, to a stack type photovoltaic device with good energy conversion efficiency.

2. Related Background Art

A variety of machinery and instruments employ photovoltaic devices including solar cells as a driving energy source and photosensors as a light receiving device.

Photovoltaic devices such as solar cells have p-n or p-i-n junctions and generally use silicon as a semiconductor for the p-n or p-i-n junctions. Single crystal silicon is preferred from the viewpoint of conversion efficiency from light energy to electromotive force, while amorphous silicon is advantageous from the viewpoint of large area formation and low cost.

In recent years, the use of polycrystalline silicon has been investigated to provide as low a cost as amorphous silicon and as high an energy conversion efficiency as single-crystal silicon. In the methods proposed so far, however, a bulk of polycrystalline silicon which is easily prepared is sliced to obtain a plate. It is therefore difficult to make the thickness less than 0.3 mm and keep the electrical resistance low when a photoelectromotive force is obtained. Further, since a plate sliced from a bulk of polycrystal is, for example, polished precisely for use as a photovoltaic device, the plate must have some mechanical strength. Therefore, a minimum thickness is required to enable sufficient light absorption and efficient utilization of material.

To form a photovoltaic device having good efficiency, the semiconductor layer thereof generating photocarriers by light irradiation should preferably be sufficiently thick for light absorption but, at the same time, thickness should be minimized for low device resistance and effective utilization of material. That is, sufficient minimization in thickness is needed for high efficiency and low production cost.

In view of the above, attempts to form a polycrystalline thin film using a thin film forming technique such as the chemical vapor deposition (CVD) method have been tried, but the crystal grain size has been at most several hundredths of a micron and the energy conversion efficiency has been low even compared to the bulk polycrystalline silicon slicing method.

Also, attempts to enlarge crystal grain size by laser light irradiation of a polycrystalline silicon thin film formed according to the above CVD method to cause melting and recrystallization have been tried, but low cost formation has not been accomplished, and stable production has been difficult.

These circumstances are present not only in case of silicon but also in cases of compound semiconductors.

Accordingly, the present applicant provided a thin type of solar cell having a sufficiently large grain size and good energy conversion efficiency, in the Japanese Patent Kokai Gazette No. 63-182872. Described therein is a solar cell comprising a substantially single-crystalline layer of a first conductivity-type semiconductor formed on a substrate based on a foreign material which exhibits a sufficiently larger nucleation density than that the material of the substrate surface and has a sufficiently small area so as to form only a single nucleus from which a single crystal is grown, and a substantially single-crystalline layer of a second conductivity type semiconductor.

FIG. 1 is a schematic drawing of such a solar cell as described in the above-mentioned gazette in which a substrate 11, foreign materials 12, p-type single-crystalline layers 13, i-type single-crystalline layers 14 and n-type single-crystalline layers 15 are found.

This solar cell is prepared using the selective single-crystal growth method. The selective single-crystal growth method causes selective crystal growth on a substrate by utilizing the difference between materials in parameters affecting nucleation in the thin film forming process such as surface energy, attaching factor, detaching factor surface diffusion rate, etc. The method involves growing a single-crystal based on a nucleation surface having a sufficiently larger nucleation density than a nonnucleation surface (having a small nucleation density) on which the nucleation surface is provided and having a sufficiently small area so as to form only a single nucleus from which a single crystal is grown. In this method, no crystal growth occurs from the nonnucleation surface, and a single-crystal is grown only from the nucleation surface.

SUMMARY OF THE INVENTION

The present invention is a method developed from the above-described prior art, and, more particularly, a method having as an object providing a photovoltaic device having good energy conversion efficiency, enabling large area formation and low cost.

It is another object of the present invention to provide a method for forming a high energy conversion efficiency photovoltaic device of the stacked type at a desired position on a substrate and to provide a photovoltaic device formed by the same method.

It is yet another object of the present invention to provide a photovoltaic device including a substrate having a plurality of conductive surfaces surrounded by an insulating surface, a plurality of first photovoltaic elements having single-crystal layer regions covering the conductive surfaces, and a second photovoltaic element covering the plurality of first photovoltaic elements. The single-crystal layer regions are separated from each other.

It is still another object of the present invention to provide a method for forming a photovoltaic device including applying vapor deposition crystal growth treatment to a substrate having a nonnucleation surface and a plurality of nucleation surfaces having a nucleation density greater than said nonnucleation surface and a size sufficiently small so as to form only a single nucleus from which a single-crystal is grown, forming a plurality of first photovoltaic elements having single-crystal layer regions so that the single-crystal layer regions are isolated respectively from each other, and forming a second photovoltaic element covering the plurality of first photovoltaic elements.

DETAILED DESCRIPTION OF THE INVENTION

The present invention will be described in detail below, referring to the accompanying drawings.

Figure 1:
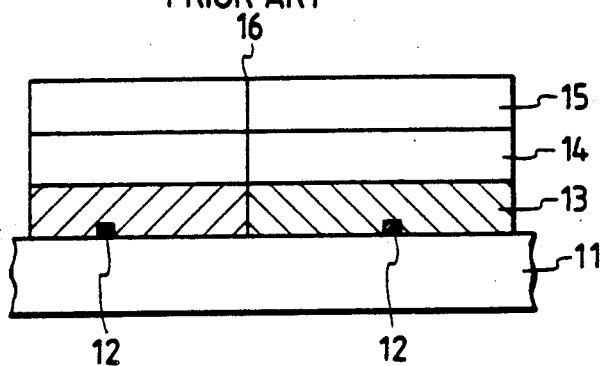
FIG. 1 is a schematic drawing illustrating a prior art example of solar cell.
Figure 2:
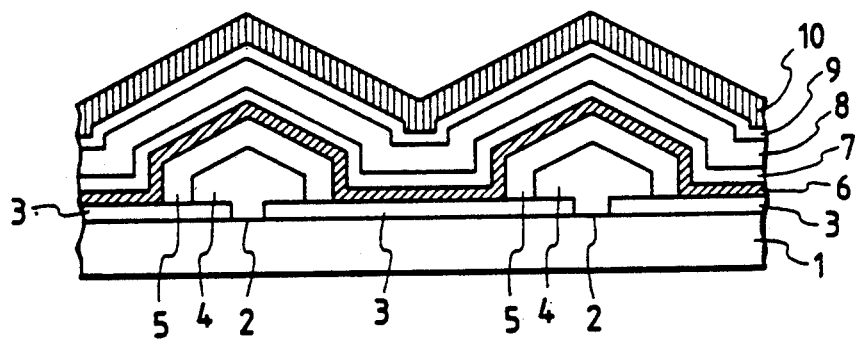
FIGS. 2–5 are schematic drawings illustrating photovoltaic devices according to the present invention.

FIG. 2 is a schematic cross-sectional view showing one embodiment of the present invention.

A photovoltaic device shown in FIG. 2 comprises a substrate of an underlying material 1 having an electroconductive surface and an insulating layer 3 formed with openings 2 exposing the underlying material 1; a first photovoltaic element having single crystal layers 4 of first conduction type provided on the openings, single crystal layers 5 covering the single crystal layers 4 and capable of efficiently generating photo-carriers by photo-irradiation and a layer 6 of second conductivity type covering the single crystal layers 5; a second photovoltaic element having an amorphous layer 7 of first conductivity type, an amorphous layer 8 of i type and an amorphous layer 9 of second conductivity type; and a transparent electro-conductive layer 10.

The present invention however is not limited to the above structure. For example, the surface of insulating layer 3 (insulating surface) may be on the same plane as the conductive surface.

The underlying material 1 for use in the present invention having an electroconductive surface includes metallic materials such as stainless steel, etc., and insulating materials such as alumina, glass, etc., the surfaces of which are made electroconductive by vapor deposition or other treatment.

The insulating layer 3 for use in the present invention includes insulating materials such as silicon oxide ($SiO_x$), silicon oxide nitride ($SiO_xN_y$), etc.

Figure 3:
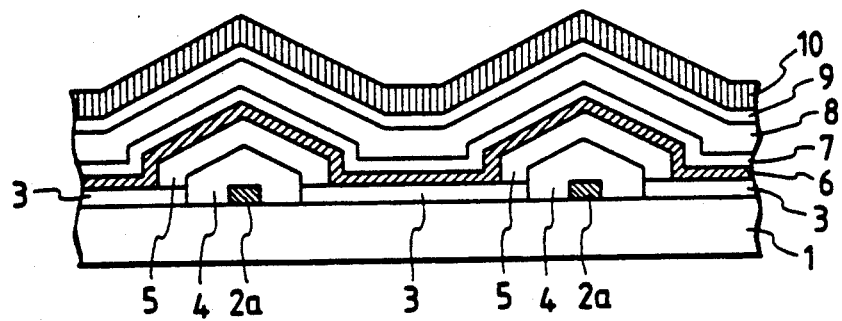

The maximum size of the openings in the insulating layer 3 is not more than 4 $\mu$m, preferably not more than 2 $\mu$m, and most preferably not more than 1 $\mu$m to obtain single crystals with particularly good selectivity, when the surface of underlying material 1 exposed at the openings is utilized as nucleation surfaces 2 and the surface of the insulating layer 3 as a nonnucleation surface, as shown in FIG. 2. The maximum size of the openings is not more than 30 $\mu$m, preferably 1 $\mu$m to 20 $\mu$m, and most preferably 2 $\mu$m to 10 $\mu$m, to form single crystal layers particularly good selectivity, when nucleation surfaces or seeds 2a are made of a different kind of material on the surface of underlying material 1 exposed at the openings and the surface of underlying material 1 exposed at the openings and the surface of insulating layer 3 are utilized as a nonnucleation surface, as shown in FIG. 3. The size of the different kind of material (foreign material) provided as a nucleation surface (seed) 2a is less than that of the diameter of the openings, preferably 4 $\mu$m or less, more preferably 2 $\mu$m or less, and optimally 1 $\mu$m or less in order to form single-crystals with good selectivity and obtain a good electrical contact with the underlying material.

In order to form single crystal layers with good selectivity, the nucleation density on the nucleation surfaces 2 and 2a is preferably not less than $10^2$ times, more preferably not less than $10^3$ times larger than that on the nonnucleation surface.

The insulating layer 3 can be formed by first forming an insulating layer on the surface of the underlying marerial 1 by a film deposition procedure such as CVD, sputtering, etc., and then forming a resist pattern therein and removing small resist-unmasked portions having sizes, for example 1 $\mu$m × 1 $\mu$m by an etching treatment, for example, reactive ion etching (RIE), etc. to expose the surface of underlying material 1 at appropriate distances, for example, 10 $\mu$m × 10 $\mu$m.

The single crystal layers 4 of first conductivity type are preferably of p-type, $p^+$-type, n-type or $n^+$-type in order to efficiently obtain the electromotive force from the first photovoltaic element. In order to obtain a good ohmic junction to the underlying material 1, a heavy doped $p^+$-type of $n^+$-type is preferred.

The size of the single crystal layers 4 is preferably larger than the size of the openings, more preferably 1 $\mu$m to 5 $\mu$m, and optimally 1.5 $\mu$m to 4 $\mu$m in order to suppress leak age current generation and obtain a good contact with the underlying material.

The single crystal layers 5 are single crystal layer regions capable of generating photo-carriers responsive to light incident on the first photovoltaic element, and is preferably of p-type, $p^-$-type, i-type, n-type, or $n^-$-type. The thickness of single crystal layers 5 is 10 $\mu$m to 50 $\mu$m, preferably 20 $\mu$m to 50 $\mu$m in order to efficiently generate photo-carriers and thereby enhance the photoelectric conversion efficiency of the photovoltaic element.

The layer 6 of second conductivity type is polycrystalline, monocrystalline, amorphous or microcrystalline (dispersion of fine crystals having grain sizes of 30 Å to 500 Å in an amorphous matrix) and is preferably opposite to the first conductivity type, i.e. p-type, $p^+$-type, n-type, or $n^+$-type.

The single crystal layer 5 is covered with the layer 6. In the first photovoltaic element, the single crystal layers 5 playing a role of efficiently generating the photo-carriers have no grain boundaries and thus reduces recombination of the photo-carriers. That is, the photovoltaic force can be efficiently obtained from the generated photo-carriers.

When a polycrystalline material is used for the layer 6, grain boundary states are formed at side of majority carriers in the band gap (that is, below the Fermi level in case of n-type or above the Fermi level in case of p-type) and thus no recombination takes place at the grain boundary states.

Furthermore, when a polycrystalline material is used for the layer 6, a polycrystalline structure without a grain boundary in the direction of current passage between the second photovoltaic element and the single crystal zone of the first photovoltaic element is particularly prefered. For example, a columnar structure may be provided in order to prevent the layer 6 from having a high resistance.

The thickness of layer 6 of second conductivity type is preferably 0.1 to 1.0 $\mu$m, and more preerably 0.2 to 0.5 $\mu$m in order to efficiently obtain the photovoltaic force.

In the present embodiment, the first photovoltaic element comprises a laminate of three layers, i.e. single-crystal layers 4, single-crystal layers 5 and a layer 6.

The second photovoltaic element is formed on the first photovoltaic element as to cover the first photovoltaic element. The second photovoltaic element comprises an amorphous layer of first conductivity type such as $p^+$-type, p-type, $p^-$-type, $n^+$-type, n-type, or $n^-$-type, an amorphous layer 8 of i-type, and an amorphous layer 9 of second conductivity type, i.e. opposite to the first conductivity type, such as $n^+$-type, n-type, $n^-$type, $p^+$-type, p-type or $p^-$-type.

The material for the second photovoltaic element need not comprise only amorphous materials, but can also be microcrystalline materials where crystals having grain sizes of 30 Å to 500 Å are dispersed in an amorphous matrix. Polycrystalline materials may also be used for the layers 7 and 9 of the second photovoltaic element having first and second conductivity types. For example, by using a microcrystalline material with less short wavelength light absorption for the layer 9 of second conductivity type on the light-receiving side, higher intensity short wavelength light can be introduced into the amorphous layer 8 of i-type capable of generating photo-carriers, and thus increase the utilization efficiency of light energy. Furthermore, by using a microcrystalline material of high electroconductivity in the layer of first conductivity type opposite the light-receiving side, the internal resistance of the second photovoltaic element can be lowered, and thus the open ciruit voltage and the short-circuit current can be increased.

The thickness of the amorphous layer 7 is 50 Å to 100 Å and preferably 50 Å to 70 Å. The thickness of the amorphous layer 8 is preferably 3,000 Å to 6,000 Å and more preferably 4,000 Å to 5,000 Å. The thickness of the amorphous layer 9 is preferably 100 Å to 500 Å and more preferably 200 Å to 300 Å.

The first photovoltaic element and the second photovoltaic element are thus successively formed on the substrate and then an upper electrode 10 for collecting the photovoltaic force is provided on the light-incoming side.

The upper electrode 10 comprises a transparent electroconductive layer etc. having a thickness of 0.4 to 1 $\mu$m, made from ITO, $SnO_2$, ZnO, etc. The transparent electroconductive layer is formed on the light-incident side of layer 9. A collector electrode of comb shape, reticular shape lattice shape, etc. may be further provided on the transparent electroconductor layer.

The photovoltaic device formed according to the present invention can use single-crystals having individual shapes surrounded by facets as single-crystalline layer regions of a photovoltaic device to efficiently utilize the irradiated light by employing a texture structure, thus enhancing the conversion efficiency. Further, the upper electrode 10 provided on the photovoltaic element opposite the substrate contacts the photovoltaic element through a large area, thus reducing the contact resistance between the upper electrode and the photovoltaic element.

One embodiment of the present photovoltaic device shown in FIG. 2 will be further explained in detail below.

Underlying material 1 is an electroconductive material composed of stainless steel and functions as an electrode (lower electrode). An insulating layer 3 composed of $SiO_2$ is formed on the underlayer material 1.

Single crystal layers 4 of the first conductivity type are monocrystalline p+-type Si layers and single crystal layers 5 are monocrystalline p-type Si. A layer 6 of second conductivity type is a polycrystalline n+-type Si layer. A first photovoltaic element comprises a laminate of these three layers.

The monocrystalline Si layers 4 and 5 are formed by a selective monocrystalline growth process. That is, the single crystal layers 4 and 5 are formed, for example, by vapor deposition crystal growth while utilizing the surface of underlying material 1 exposed through the insulating layer 3 and being small enough as a nucleation surface to form only a single nucleus from which a single crystal is grown by the crystal growth procedure and the surface of $SiO_2$ layer 3 is a nonnucleation surface.

Amorphous layers 7, 8 and 9 are an amorphous Si: H layer of p-type, an amorphous Si: H layer of i-type and an amorphous Si: H layer of n-type, respectively. A second photovoltaic element comprises these three layers. The amorphous layers 7, 8 and 9 may contain a halogen atom.

An upper electrode 10 composed of tin-containing indium oxide (ITO) is provided on the amorphous layer 9.

In the foregoing, one embodiment of the present photovoltaic device has been shown, but the present invention is not limited only to the foregoing embodiment.

For example, the first photovoltaic element can be provided alone or in a plurality in the present invention. When the present photovoltaic device is applied to a power supply means composed of solar cells, etc. particularly requiring a larger area, a plurality of the first photovoltaic elements are provided to give a photovoltaic device of higher output.

When the present photovoltaic device having a plurality of first photovoltaic elements is used in solar cells, it is desirable to regularly arrange the first photovoltaic elements to suppress fluctuations in the current and voltage from each of the plurality of the photovoltaic element. Preferable examples of the regular arrangement include highly symmetrical arrangements of the first photovoltaic elements such as square lattices (4 symmetrical positions) and honey-comb lattices (six symmetrical positions), etc.

In using the present invention in solar cells, the extent of the single crystal zone is preferably 5 to 300 $\mu$m, and more preferably 10 to 100 $\mu$m and the distance between the single crystal zones is preferably 0.1 to 10 $\mu$m, more preferably 0.3 to 5 $\mu$m, and optimally 0.5 to 3 $\mu$m in order to obtain a high conversion efficiency.

Projected area ratio ($S_{cryst}/S_{amor}$) of the single crystal zone of first photovoltaic element to the second photovoltaic element of the light-receiving surface of a solar cell in the direction from the light-receiving surface to the substrate is preferably 0.5 to 1.0, more preferably 0.7 to 1.0, and optimally 0.9 to 1.0.

When the present photovoltaic devices are used in the light-receiving part of a sensor such as a line sensor of long length, etc., the devices can be arranged in accordance with a pattern of image elements at desired distances, where the photovoltaic devices to be arranged at the light-receiving part of the sensor can be so arranged as to provide a single photovoltaic element or a plurality thereof at each image element. In the case of providing a plurality of photovoltaic elements, the extent of a single crystal zone may be 5 to 100 $\mu$m and the distance between the single crystal zones is 0.1 to 10 $\mu$m in order to enhance the sensitivity per image element and reduce the fluctuations between the sensor image elements.

When a plurality of first photovoltaic elements are provided in the present photovoltaic device, the single crystal zone is arranged preferably in an extent of 6 to 310 $\mu$m, more preferably 10 to 100 $\mu$m, In the present invention, the single crystal zone of a first photovoltaic element is formed by applying a selective crystal growth treatment, for example a gas phase process such as a chemical vapor deposition (CVD) process including a thermal CVD process, a plasma CVD process, a photo CVD process, etc., or physical vapor deposition processes including a vapor deposition process, a sputtering process, etc. on to a substrate having a nonnucleation surface and a nucleation surface having a larger nucleation density than that on the nonnucleation surface. The nucleation surface is small enough to form only a single nucleus from which a single crystal is grown by the crystal growth treatment, as explained above.

An example of the gas phase crystal growth treatment is a thermal CVD process of making, for example, Si single crystals on a $SiO_2$ surface as a nonnucleation surface and a stainless steel surface as a nucleation surface under such conditions as a substrate temperature of about 700° C. to about 1,100° C. and a reaction pressure of e.g. 0.1 to 500 Torr, preferably 100 to 200 Torr, using an appropriate combination of a reaction gas such as, for example, $SiH_2Cl_2$, $SiCl_4$, $DiCl_3$, $SiHCl_3$, $SiF_4$, $SiH_4$, etc., an etching gas such as gases containing a halogen atom, for example, HCl, etc., and a diluent gas such as $H_2$, etc.

Furthermore, gaseous materials containing an atom convertible to a dopant such as $PH_3$, $B_2H_6$, etc. for controlling the conductivity type can be used as a doping gas.

According to one example of crystal growth of single crystal layer 4 of p-type and single crystal layer 5 of p-type in the above-mentioned embodiment, the layers 4 and 5 are successively formed by the selective single crystal growth procedure using a mixture of $SiH_2Cl_2 + HCl + H_2$ in a flow rate ratio of 1.2:1.4:100 as gases introduced with $B_2H_6$ as a doping gas at a substrate temperature of 900° C. under a pressure of 150 Torr, while appropriately changing the concentration of the doping gas.

The procedures for forming layers other than those in the single crystal zone, e.g. for amorphous layers, are used processes for forming amorphous photovoltaic elements such as a plasma CVD process, a sputtering process, etc.

In order to form a polycrystalline semiconductor layer, the crystal growth treatment must be conducted under such conditions so as to easily form nuclei on the surface of a substrate having the single crystal layers 4 and 5 by increasing the mixing ratio of the gaseous raw material containing an atom of the semiconductor crystal material or by lowering the mixing ratio of the etching gas to less than that of the aforementioned selective crystal growth treatment to generate nuclei even on the insulating layer and cover the single crystal layer 5 and the insulating layer, or by lowering the substrate temperature to suppress the reevaporation and diffusion of adsorbed atoms of by a combination thereof.

According to the present process for forming a photovoltaic device, photovoltaic elements can be formed at desired positions on the substrate and thus the freedom of design of solar cells, sensors, etc. can be expanded and the first and second photovoltaic elements can be formed one upon another. According to the present invention, a photovoltaic device with high photo-energy utilization in photoelectric conversion and a high conversion efficiency can be provided.

In the photovoltaic device shown in FIG. 2 as one embodiment of the present invention, the adjacent single crystal zones of the first photovoltaic element are not in contact with another first photovoltaic element, and thus the single crystal layer 5 playing a role of carrier generation in the first photovoltaic element has no grain boundary to cause formation of a grain boundary level giving rise to the recombination of carriers. That is, the first photovoltaic element itself has a high energy conversion efficiency. Furthermore, in the zone between the first photovoltaic elements, there is the second photovoltaic element comprising the amorphous semiconductor layers 7 to 9 in which zone an incident light can be photo-electrically converted to obtain an electric energy. Thus, in the foregoing embodiment, high overall energy conversion efficiency can be obtained.

In the foregoing embodiment, low cost, radily available stainless steel is used as the underlying material 1 and the second photovoltaic element comprises amorphous semiconductor layers. Thus, a larger area and lower cost can be achieved.

Figure 4:
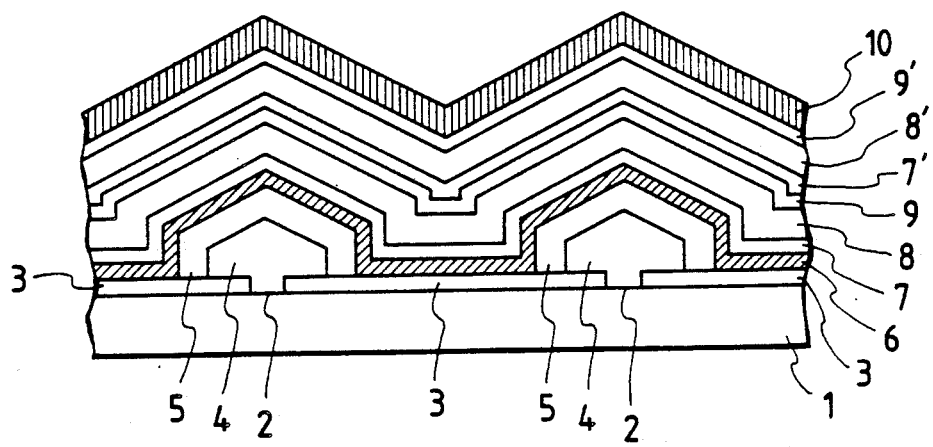

FIG. 4 is a schematic cross-sectional view showing a second embodiment of the present photovoltaic device, where the same members as in FIG. 2 are identified by the same numerals.

In the second embodiment, an amorphous $Si_xC_{1-x}$:H layer 7' of the p-type, an amorphous $Si_xC_{1-x}$:H layer 8' of i-type, and an amorphous $Si_xC_{1-x}$: layer 9' of n-type are formed between the layer 9 and the electrode 10 of the foregoing first embodiment, where $0 < X \leq 1$, and the amorphous layers 7', 8' and 9' may contain a halogen atom.

The thickness of amorphous layer 7' is preferably 50 Å to 100 Å, and more preferably 50 Å to 70 Å. The thickness of amorphous layer 8' is preferably 2,000 Å to 4,000 Å, and more preferably 2,500 Å to 3,500 Å. The thickness of amorphous layer 9' is preferably 100 Å to 500 Å, and preferably 200 Å to 300 Å. These layers can be formed by a gas phase procedure, for example, an RF plasma CVD process, a DC plasma CVD process or a sputtering process, wherein a mixture of a silicon-containing gas such as $SiH_4$, $Si_2H_6$, etc., and a carbon atom-containing gas such as $CH_4$, $C_2H_6$, etc. can be used as a raw material gas. A material containing a group III element of the periodic table such as $B_2H_6$ or a material containing a group V element of the periodic table such as $PH_3$ may be added as a doping gas.

In the foregoing second embodiment, a third photovoltaic element comprising the amorphous semiconductor layers 7', 8' and 9' having a larger band gap is provided besides the layer structure of the first embodiment and thus the short-wavelength light can undergo efficient energy conversion. That is, overall energy conversion efficiency can be further increased.

The amorphous layers 7' and 9' of the third photovoltaic element may be made of a microcrystalline material. Furthermore, the materials of the second and third photovoltaic elements are not limited only to the Si system and the Si-C system, but other semiconductor materials such as Si-Ge, Si-N, etc. can also be used. Materials for the single crystal zone of the first photovoltaic element are not limited only to the Si system, but other semiconductor crystalline materials such as Ge, InP, GaAs, etc. can also be used.

FIG. 3 is a schematic cross-sectional view showing a third embodiment of the present photovoltaic element, wherein the same members as in FIGS. 2 and 4 are identified with the same numerals.

The third embodiment is an example of forming an insulating layers 3 composed of $SiO_2$ on the surface of underlying material 1 while leaving considerably large $SiO_2$-free areas on the surface of underlying material, whereby very small single crystal Si layers 2a are formed at the centers of the individual $SiO_2$-free areas and the single crystal Si layer 4 is in contact with the underlying material 1 with the large area. These are structural differences of the third embodiment from the first embodiment.

The single crystal layer 2a can be formed by the aforementioned crystal growth treatment using a material having a higher nucleation density than that of the underlying material 1, for example, silicon nitride, etc. with composition changes by silicon ion implanting as a nucleation surface. Alternatively, polycrystalline or amorphous semiconductor material (seed) small enough to aggregate into a single body by heat treatment on the underlying material in the openings may be provided, followed by heat treatment at a lower temperature than the melting point of the seed to make the seek grow into a single body.

Selective single crystal growth for forming the single crystal layer 4 and the single crystal layer 5 is carried out by utilizing the exposed surface of the fine Si layer 2a as a nucleating surface and the exposed surface of underlying material 1 having a smaller nucleation desnity than that of fine Si layer and the surface of $SiO_2$ layer as nonnucleation surfaces. The layer 4 is formed so as to cover the exposed surface of underlying material 1. The layer 4 may be formed so it extends over the exposed surface of underlying material 1 onto the $SiO_2$ layer 3. The steps following the formation of layer 5 are carried in the same manner as in the first embodiment.

In the third embodiment, the layer 4 is in contact with a larger area of the underlying mateial. Thus the series resistance and carrier recombination is decreased and the energy conversion efficiency can be increased.

EXAMPLE 1

Referring to FIG. 2, on an electroconductive underlying material 1 made of stainless steel, an $SiO_2$ layer 3 was formed to a layer thickness of 1500 Å. The $SiO_2$ layer was first formed over the whole surface of the underlying material 1. Subsequently, a resist pattern was formed thereon, and portions of the surface of the underlying material 1 were uncovered by removing micro portions of the $SiO_2$ layer (1 $\mu$m × 1 $\mu$m) in appropriate spacings (10 $\mu$m × 10 $\mu$m) by reactive ion-etching (RIE).

The single crystal layers 4 and 5 were formed according to a selective single crystal growth method. That is, crystals were grown according to a vapor phase method by utilizing the surface of the uncovered portions of the underlying material formed after partial removal of the aforementioned $SiO_2$ layer 3 as the nucleus-forming face and by utilizing the surface of the $SiO_2$ layer 3 as the non-nucleus-forming face where the formation density is lower than that in the aformentioned nucleus-forming face. The layers 4 and 5 were successively formed according to a single crystal forming method by using a mixed gas of $SiH_2Cl_2 + HCl + H_2$ (Flow rate ratio=1.2:1.4:100) and $B_2H_6$ as a doping gas at a temperature of 900° C. and under a pressure of 150 Torr by changing the mixing ratio of the aformentioned doping gas. The diameters of the layers 5 were 8 $\mu$m. The aforementioned polycrystalline Si layer 6 was formed by a CVD method under the same conditions as in the above crystal growth treatment, except that HCl was not introduced and $PH_3$ was used as the dopant, so as to cover the exposed surface of the layers 5 and the surface of the $SiO_2$ layer 3.

The layers 7, 8 and 9 are respectively a p-type amorphous Si:H layer, an i-type Si:H layer, and an n-type amorphous Si:H layer, by which a second photovoltaic element is constituted. These layers were formed on the aforementioned layer 6 under the conditions specified below, according to an RF plasma CVD method.

Specifically, $SiH_4$ (10 sccm), $H_2$ (10 sccm), and diborane diluted with hydrogen to 1% concentration (1% $B_2H_6/H_2$) (1 sccm) were introduced into an RF plasma CVD apparatus, and the pressure of the reaction chamber was maintained at 0.5 Torr. The p-type amorphous Si:H layer 7 was formed to a thickness of 300 Å by generating a plasma by means of high-frequency electric power of 13.56 MHz with the underlying material kept at 250° C. Then, the introduction of 1%-$B_2H_3/H_2$ was stopped to form the i-type amorphous Si:H layer 8 to a thickness of 4000 Å. Thereafter phosphine diluted to 1% concentration with hydrogen (1% $PH_3/H_2$) (1 sccm) together with $SiH_4$ (10 sccm) and $H_2$ (10 sccm) were introduced into the reaction chamber kept at a pressure of 0.5 Torr to form the n-type amorphous Si:H layer 9 to a thickness of 50 Å.

The upper electrode 10 is a light-transmissive electroconductive layer composed to ITO of a thickness of 1 $\mu$m. The layer was formed on the light-receiving side of the aforementioned layer 9.

In this Example, the underlying material 1 functions as the other electrode.

In the photovoltaic device of this Example, no grain boundaries exist because the adjacent single crystal layers of the first electrovoltaic element do not come into contact with each other. Accordingly, the first photovoltaic device itself exhibits a high energy conversion efficiency. Additionally, the second photovoltaic elements comprising the amorphous semiconductor layers 7, 8 and 9 exist in the intermediate regions between the first photovoltaic elements. Incident light is also converted photoelectrically into electric energy in these regions. Consequently, high total energy conversion efficiency is attainable in this example. Moreover, larger device area and lower production cost are achievable since the underlying layer 1 is made of stainless steel, and the second photovoltaic elements comprise amorphous semiconductor layers.

EXAMPLE 2

Referring to FIG. 4, in this Example, a p-type amorphous $Si_xC_{1-x}$:H layer 8', and an n-type amorphous $Si_xC_{1-x}$:H layer 9' are formed between the layer 9 and the electrode 10 of the aforementioned Example 1, where $0 < X \leq 1$.

These layers 7', 8' and 9' are formed by an RF plasma CVD method, a DC plasma CVD method, or the like. In this formation, a mixed gas comprising a silicon atom-containing $SiH_4$ gas and a carbon atom-containing $CH_4$ gas, is used as the starting material gas. As the doping gases for forming a p-type semiconductor layer and an n-type semiconductor layer, a material, such as $B_2H_6$, containing an element of Group III of the periodic table, and a material, such as $PH_3$, containing an element of Group V may be used, respectively.

Specifically, $SiH_4$ (7 sccm), $CH_4$ 3 sccm), $H_2$ (10 sccm), and 1%-$B_2H_6/H_2$ (1 sccm) were introduced into an RF plasma CVD apparatus, and the presence in the reaction chamber was maintained at 0.5 Torr. The p-type amorphous $Si_xC_{1-x}$:H layer 7' was formed to a thickness of 300 Å on the underlying material kept at 300° C. by generating a plasma by means of high-frequency electric power of 13.56 MHz. Then, the introduction of 1% $B_2H_6/H_2$ was stopped to form the i-type amorphous $Si_xC_{1-x}$:H layer 8' at a thickness of 4000 Å. Thereafter 1%-PH$_3$/H$_2$ (1 sccm) together with SiH$_4$ (7 sccm), CH$_4$ (3 sccm), and H$_2$ (10 sccm) were introduced into the reaction chamber kept at pressure of 0.5 Torr to form the n-type amorphous $Si_xC_{1-x}$:H layer 9' to a thickness of 50 Å.

In this example, further improvement in total efficiency of energy conversion could be attained by effectively converting, with the larger energy gap amorphous semiconductor layers 7', 8', and 9', the light of shorter wavelength which the amorphous semiconductor layers 7, 8 and 9 of Example 1 do not effectively convert.

EXAMPLE 3

Referring to FIG. 3, in this example, the area of the SiO$_2$-lacking portions provided in the formation of the SiO$_2$ layer 3 on the surface of the underlying material 1 is larger, and micro single crystalline Si layers 2a are formed by condensation of the seeds at the centers of the SiO$_2$-lacking portions, while the single crystalline Si layers 4 are in contact with the underlying material 1 through a larger area. The selective single crystal growth in formation of the layers 4 occurs from the minute Si layers 2a, with the exposed surface of the underlying material 1 and the exposed layer of the SiO$_2$ layer serving as a non-nucleus-forming fact. The layers 4 are formed so as to cover the exposed surface of the underlying material 1 completely. The formation of the layer 5 and the subsequent processes are conducted in the same manner as in Example 1 described above.

In this Example, since the layers 4 are in contact with the underlying material 1 through a large area, series resistance and carrier recombination are decreased to raise the energy conversion efficiency.

EXAMPLE 4

Figure 5:
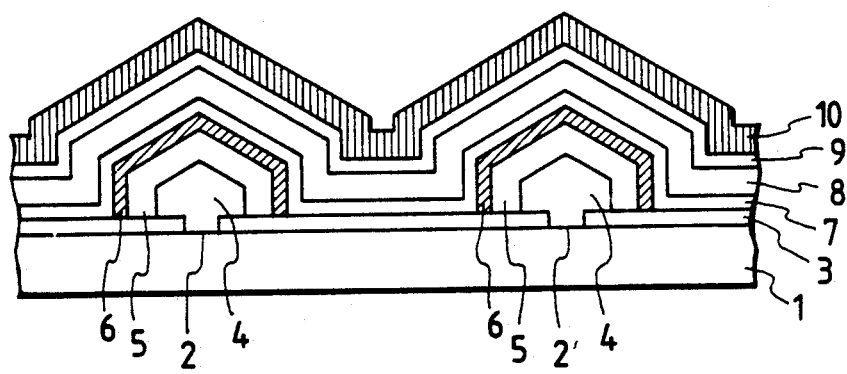

A photovoltaic device illustrated in FIG. 5 was prepared in the same manner as in Example 1 except that n$^+$-type polycrystal layers 6 of the first photovoltaic element as shown in FIG. 2 were formed as single crystal layers subsequent to the formation of the single crystal layers 4 and 5. The formation of the single crystal layer 6 in FIG. 5 was conducted by introducing a mixed gas of SiH$_2$Cl$_2$+HCl+H$_2$ (Flow rate ratio=1.2:1.4:100) together with 1%-PH$_3$/H$_2$ at a flow rate ratio of 0.2 based on SiH$_2$Cl$_2$ at a temperature of 900° C. and under a pressure of 150 Torr.

The photovoltaic device prepared in this example exhibits higher efficiency in comparison with the one of Example 1 because of the larger single crystal region, and because the variation of the characteristics of the first photovoltaic element which may have resulted from the influence of grain boundaries was prevented, so that the output corresponded exactly to the intensity of incident light.

We claim:

1. A photovoltaic device comprising:
    a substrate having a plurality of mutually spaced conductive surfaces each surrounded by an insulating surface,
    a first photovoltaic element having a single-crystal layer region covering each conductive surface thereby forming a plurality of first photovoltaic elements, and
    a second photovoltaic element covering said plurality of first photovoltaic elements,
    said single-crystal layer regions being separated from each other.

2. A photovoltaic device according to claim 1, wherein said second photovoltaic element comprises an amorphous material.

3. A photovoltaic device according to claim 1, wherein said second photovoltaic element has a layer region comprising a microcrystalline material.

4. A photovoltaic device according to claim 1, wherein the nucleation density of said conductive surfaces is greater than the nucleation density of said insulating surface and the size of said conductive surfaces is 4 μm or less in diameter.

5. A photovoltaic device according to claim 1, wherein materials of 4 μm or less in diameter having a nucleation density greater than said conductive surfaces and than said insulating surface are provided on said conductive surfaces.

6. A photovoltaic device according to claim 1, wherein said first photovoltaic element has a p-type semiconductor single-crystal layer and an n-type semiconductor single-crystal layer.

7. A photovoltaic device according to claim 1, wherein said second photovoltaic element has a p-type semiconductor non-single-crystal layer, an i-type semiconductor non-single-crystal layer and an n-type semiconductor non-single-crystal layer.

8. A photovoltaic device according to claim 1, further comprising a third photovoltaic element on said second photovoltaic element.

9. A photovoltaic device according to claim 8, wherein said third photovoltaic element has a semiconductor non-single-crystal layer.

10. A method for forming a photovoltaic device comprising:
    applying crystal growth treatment by vapor deposition to a substrate having a nonnucleation surface and a plurality of spaced apart nucleation surfaces having a nucleation density greater than said nonnucleation surface and a size sufficiently small so as to form only a single nucleus from which a single-crystal is grown,
    forming a first photovoltaic element having a single-crystal layer region on each nucleation surface so that said single-crystal layer regions are isolated from each other thereby forming a plurality of first photovoltaic elements, and
    forming a second photovoltaic element covering said plurality of first photovoltaic elements.

11. A method according to claim 10, wherein said nucleation surfaces comprise a surface of an underlying material and said nonnucleation surface is of a surface of an insulating layer.

12. A method according to claim 10, wherein said nonnucleation surface comprises a surface of an underlying material and of a surface of an insulating layer while said nucleation surfaces comprise a surface of a material having a nucleation density greater than said nonnucleation surface.

13. A photovoltaic device formed by the method for forming a photovoltaic device of claim 10.

* * * * *

UNITED STATES PATENT AND TRADEMARK OFFICE
CERTIFICATE OF CORRECTION

PATENT NO. : 5,094,697

DATED : March 10, 1992

INVENTOR(S) : AKIHARU TAKABAYASHI ET AL.    Page 1 of 2

It is certified that error appears in the above-identified patent and that said Letters Patent is hereby corrected as shown below:

COLUMN 1

Line 8, "cell," should read --cells,--.

COLUMN 2

Line 17, "factor" should read --factor,--.

COLUMN 3

Line 45, "layers" should read --layers with--.
    Line 65, "marerial" should read --material--.

COLUMN 4

Line 9, "of" should read --or--.
    Line 17, "is" should read --are--.
    Line 30, "layer 5 is" should read --layers 5 are--.
    Line 33, "reduces" should read --reduce--.
    Line 38, "side" should read --sides--.
    Line 48, "prefered." should read --preferred.--.
    Line 52, "preerably" should read --preferably--.
    Line 59, "as" should be deleted.

COLUMN 5

Line 17, "ciruit" should read --circuit--.

COLUMN 8

Line 11, "radily" should read --readily--.
    Line 64, "layers" should read --layer--.

UNITED STATES PATENT AND TRADEMARK OFFICE
CERTIFICATE OF CORRECTION

PATENT NO. : 5,094,697
DATED : March 10, 1992
INVENTOR(S) : AKIHARU TAKABAYASHI ET AL.    Page 2 of 2

It is certified that error appears in the above-identified patent and that said Letters Patent is hereby corrected as shown below:

COLUMN 9

Line 5, "layer 2a" should read --layers 2a--.
Line 15, "seek" should read --seed--.
Line 22, "snity" should read --nsity--.
Line 28, "carried" should read --carried out--.
Line 30, "series" should be deleted.
Line 59, "aformentioned" should read --aforementioned--.

COLUMN 10

Line 13, "$B_2H_3/H_2$" should read --$B_2H_6/H_2$--.
Line 22, "to" should read --of--.
Line 60, "3" should read --(3--.

COLUMN 12

Line 56, "is of" should read --comprises--.
Line 60, "of" (first occurrence) should be deleted.

Signed and Sealed this

Second Day of November, 1993

Attest:

BRUCE LEHMAN

Attesting Officer    Commissioner of Patents and Trademarks